(12) United States Patent
Elattari et al.

(10) Patent No.: US 8,378,445 B2
(45) Date of Patent: Feb. 19, 2013

(54) TRENCH STRUCTURES IN DIRECT CONTACT

(75) Inventors: Brahim Elattari, München (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 190 days.

(21) Appl. No.: 12/872,201

(22) Filed: Aug. 31, 2010

(65) Prior Publication Data

US 2012/0049274 A1    Mar. 1, 2012

(51) Int. Cl.
*H01L 21/4763* (2006.01)
*H01L 21/762* (2006.01)
*H01L 29/06* (2006.01)

(52) U.S. Cl. ............... 257/508; 257/503; 257/E21.545; 257/E29.024; 257/E21.544; 438/430

(58) Field of Classification Search ............... None
See application file for complete search history.

(56) References Cited

U.S. PATENT DOCUMENTS

| | | | | |
|---|---|---|---|---|
| 4,320,411 A * | 3/1982 | Fukushima | ..................... | 257/511 |
| 5,614,750 A * | 3/1997 | Ellul et al. | ..................... | 257/386 |
| 6,121,102 A * | 9/2000 | Norstrom et al. | ................ | 438/361 |
| 7,468,307 B2 * | 12/2008 | Hartner et al. | ................ | 438/430 |
| 7,982,284 B2 * | 7/2011 | Meiser et al. | ................ | 257/520 |
| 8,115,279 B2 * | 2/2012 | Tilke et al. | ................ | 257/548 |
| 8,138,575 B2 * | 3/2012 | Stecher | ................ | 257/552 |
| 2005/0127473 A1 * | 6/2005 | Sakagami | ................ | 257/510 |
| 2006/0209586 A1 | 9/2006 | Hirler | | |
| 2008/0012090 A1 * | 1/2008 | Meiser et al. | ................ | 257/506 |
| 2009/0273030 A1 * | 11/2009 | Schrems et al. | ................ | 257/337 |

FOREIGN PATENT DOCUMENTS

DE    102005008354 B4    8/2006

OTHER PUBLICATIONS

Kim, Cheon Soo, et al, Trenched-Sinker LDMOSPET (TS-LDMOSE) Structure for 2GHz Power Amplifiers ETRI Journal, vol. 25, No. 3, 2003 p. 195.*
De Pestel, F. et al., "Deep Trench Isolation for a 50V 0.35 μm Based Smart Power Technology", Technology Research & Development, AMI Semiconductor Belgium BVBA.

* cited by examiner

*Primary Examiner* — Thomas L Dickey
*Assistant Examiner* — Joseph Schoenholtz
(74) *Attorney, Agent, or Firm* — Murphy, Bilak & Homiller, PLLC

(57) ABSTRACT

A semiconductor structure includes a semiconductor substrate of a first conductivity, an epitaxial layer of a second conductivity on the substrate and a buried layer of the second conductivity interposed between the substrate and the epitaxial layer. A first trench structure extends through the epitaxial layer and the buried layer to the substrate and includes sidewall insulation and conductive material in electrical contact with the substrate at a bottom of the first trench structure. A second trench structure extends through the epitaxial layer to the buried layer and includes sidewall insulation and conductive material in electrical contact with the buried layer at a bottom of the second trench structure. A region of insulating material laterally extends from the conductive material of the first trench structure to the conductive material of the second trench structure and longitudinally extends to a substantial depth of the second trench structure.

11 Claims, 17 Drawing Sheets

TRENCH STRUCTURES IN DIRECT CONTACT

BACKGROUND

Some types of integrated power MOS transistors have an n-doped buried layer contacted by a highly n-doped sinker. An n-doped sinker confined within the interior of a trench and isolated laterally by a thin oxide layer reduces cell spacing compared to sinkers formed by diffusion. The same integrated power MOS transistors typically have a p-doped sinker or substrate contact at the periphery and between two neighbouring power MOS transistors to electrically isolate the transistors from each other. The substrate contact is also conventionally confined within a trench and isolated laterally by insulated sidewalls. However, the mesa of semiconductor material between the sinkers is floating. As such, both p-type and n-type channels can form in theses regions. The insulated sidewalls must be thick enough to block the maximum voltage of these parasitic devices. For example, an oxide thickness of 700 nm is typically used to ensure suitable voltage protection. Subsequent processing for opening the oxide at the bottom of the trenches leads to considerable thinning of the sidewall oxide to about 450 nm at the upper part of the trenches. Higher blocking voltages require even thicker oxides which cause stress that can result in crystal defects. A trench structure that allows higher blocking voltage with the same oxide thickness during processing would be beneficial.

The floating mesa of semiconductor material between neighbouring n-type and p-type sinkers also causes parasitic capacitances between the n-type and p-type sinkers which are much higher than capacitances between widely spaced diffused sinkers due to the formation of inversion and accumulation channels. Furthermore, the n-type and p-type sinker termination regions of a conventional power transistor array tend to consume about 2×3 µm per trench and require 6 µm spacing. Processing constraints often require the n-type and p-type sinker trenches to be closed rings. Space and thereby cost can be saved by reducing the number of rings.

SUMMARY

According to an embodiment of a semiconductor structure, the structure includes a semiconductor substrate of a first conductivity, an epitaxial layer of a second conductivity on the substrate and a buried layer of the second conductivity interposed between the substrate and the epitaxial layer. A first trench structure extends through the epitaxial layer and the buried layer to the substrate and includes sidewall insulation and conductive material in electrical contact with the substrate at a bottom of the first trench structure. A second trench structure extends through the epitaxial layer to the buried layer and includes sidewall insulation and conductive material in electrical contact with the buried layer at a bottom of the second trench structure. A region of insulating material laterally extends from the conductive material of the first trench structure to the conductive material of the second trench structure and longitudinally extends to a substantial depth of the second trench structure.

According to an embodiment of a method of forming a semiconductor structure, the method includes providing a semiconductor substrate of a first conductivity, forming a buried layer of a second conductivity on or partially or completely in the substrate and forming an epitaxial layer of a second conductivity on the substrate so that the buried layer is interposed between the substrate and the epitaxial layer. The method further includes forming a first trench structure extending through the epitaxial layer and the buried layer to the substrate with sidewall insulation and a first conductive material in electrical contact with the substrate at a bottom of the first trench structure. The method also includes forming a second trench structure extending through the epitaxial layer to the buried layer with sidewall insulation and a second conductive material in electrical contact with the buried layer at a bottom of the second trench structure and forming a region of insulating material laterally extending from the first conductive material to the second conductive material and longitudinally extending to a depth in closer proximity to the bottom of the second trench structure than an upper surface of the epitaxial layer.

According to another embodiment of a semiconductor structure, the structure includes a substrate of a first conductivity, an epitaxial layer of a second conductivity on the substrate and a buried layer of the second conductivity interposed between the substrate and the epitaxial layer. A first trench structure extends through the epitaxial layer and the buried layer to the substrate with a first conductive material in electrical contact with the substrate. A second trench structure extends through the epitaxial layer to the buried layer with a second conductive material in electrical contact with the buried layer. An oxidized region of semiconductor material laterally extends from a side of the first conductive material facing the second trench structure to a side of the second conductive material facing the first trench structure so that the region between the first and second trench structures is substantially devoid of semiconductor material to a substantial depth of the second trench structure.

According to an embodiment of an integrated circuit, the integrated circuit includes a substrate of a first conductivity, an epitaxial layer of a second conductivity on the substrate, a buried layer of the second conductivity interposed between the substrate and the epitaxial layer and a transistor formed at a region of the substrate. A first trench structure extends through the epitaxial layer and the buried layer to the substrate for electrically isolating the transistor from adjacent transistors. The first trench structure includes a first conductive material in electrical contact with the substrate. A second trench structure extends through the epitaxial layer to the buried layer. The second trench structure includes a second conductive material in electrical contact with the buried layer. An oxidized mesa of semiconductor material laterally extending from the first conductive material to the second conductive material and longitudinally extending to a depth in closer proximity to the bottom of the second trench structure than an upper surface of the epitaxial layer.

According to an embodiment of a power transistor, the power transistor includes a source region of a first conductivity formed in a semiconductor substrate, a body region of a second conductivity disposed above the source region, a drift region of the first conductivity disposed above the body region so that the body region is interposed between the source region and the drain region and a gate structure extending through the drift region and the body region into the source region. A first trench structure extends through the drift region and the body region to the source region. The first trench structure includes a first conductive material in electrical contact with the source region. A second trench structure extends through the drift region to the body region. The second trench structure includes a second conductive material in electrical contact with the body region. An oxidized region of semiconductor material laterally extending from a side of the first conductive material facing the second trench structure to a side of the second conductive material facing the first trench structure and longitudinally extending to a depth in closer proximity to the bottom of the second trench structure than an upper surface of the drift region.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
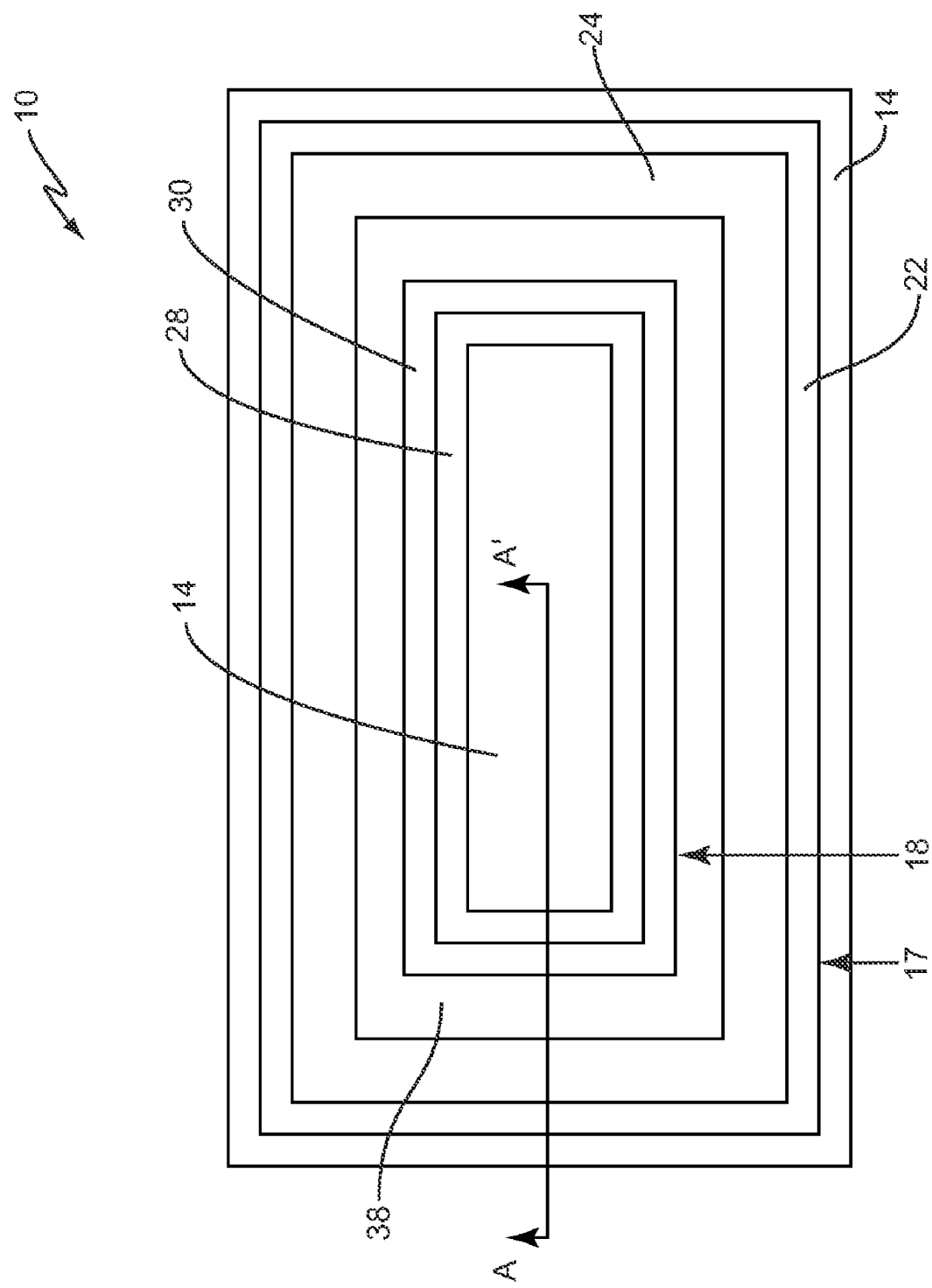
FIG. 1 is a top-down plan view of a semiconductor structure according to an embodiment.
Figure 2:
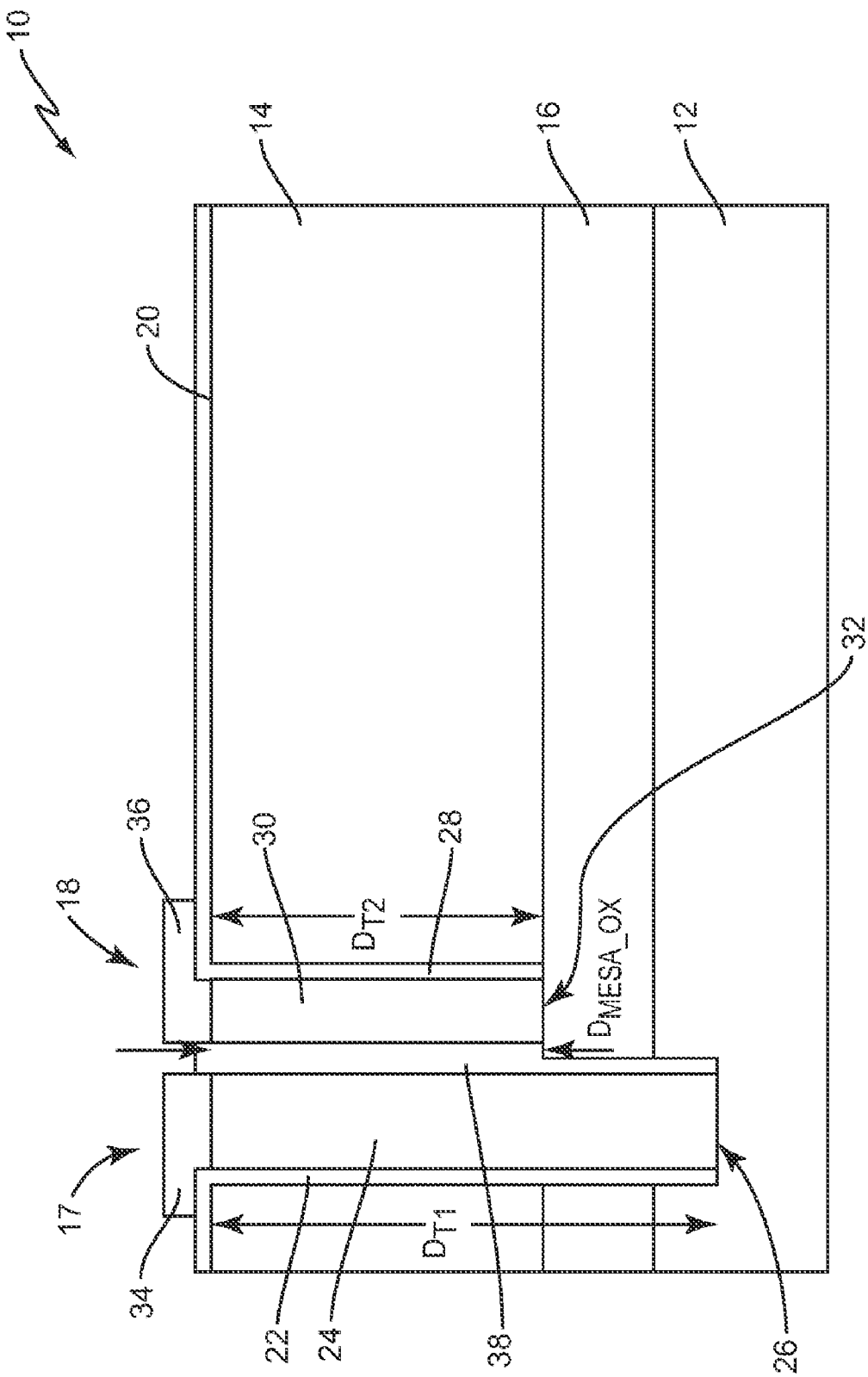
FIG. 2 is a schematic cross-sectional view of the semiconductor structure in FIG. 1.

FIG. 1 illustrates a top-down plan view of a semiconductor structure 10 e.g. for use in constructing transistors such as power MOS transistors. FIG. 2 illustrates a cross-sectional view of the semiconductor structure 10 shown in FIG. 1 along the line labeled A-A' with conductive contacts which are not shown in FIG. 1 for ease of illustration only. The semiconductor structure 10 includes a semiconductor substrate 12 of a first conductivity e.g. p-type or alternatively n-type. An epitaxial layer 14 of the opposite conductivity (n-type for a p-type substrate and p-type for an n-type substrate) is grown on the substrate 12. Power MOS transistors or other types of transistor devices can be fabricated at least partly in the epitaxial layer 14 as described later herein.

Disposed between the epitaxial layer 14 and the substrate 12 is a buried layer 16 of the same conductivity as the epitaxial layer 14. The semiconductor structure 10 also includes a first deeper trench structure 17 and a shallower trench structure 18. The deeper trench structure 17 includes a trench that extends through the epitaxial layer 14 and the buried layer 16 to the substrate 12 at a depth $D_{T1}$ from the upper surface 20 of the epitaxial layer 14. The deeper trench is oxidized to form insulation 22 on the sidewalls of the trench. The insulation on the bottom is removed and the trench filled with conductive material 24 to form an electrical contact with the substrate 12 at the bottom 26 of the trench. The shallower trench structure 18 has a trench that extends through the epitaxial layer 14 to the buried layer 16 at a depth $D_{T2}$ from the upper surface 20 of the epitaxial layer 14, but not to the substrate 12 like the deeper trench. The shallower trench also has sidewall insulation 28 with the bottom insulation removed. The shallower trench is filled with conductive material 30 so that an electrical contact is made with the buried layer 16 at the bottom 32 of the shallower trench where the insulation was removed. A first conductive contact 34 is electrically connected to the conductive material 22 of the deeper trench structure 17 and a second conductive contact 36 is electrically connected to the conductive material 30 of the shallower trench structure 18. The first and second conductive contacts 34, 36 are electrically isolated from each other.

The deeper trench structure 17 provides an electrical conduction path to the substrate 12 which has one conductivity and the shallower trench structure 18 provides an electrical conduction path to the buried layer 16 which has the opposite conductivity. The sidewall insulation 22 of the deeper trench structure 17 ensures the conductive fill material 24 in the deeper trench is electrically insulated from the epitaxial layer 14 and the buried layer 16. The sidewall insulation 28 of the shallower trench structure 18 similarly ensures the conductive fill material 30 in the shallower trench is electrically insulated from the epitaxial layer 14.

The insulated sidewalls of the trench structures that face each other form a region 38 of insulating material that laterally extends from the side of the conductive material 24 in the deeper trench to the facing side of the conductive material 28 in the shallower trench and longitudinally extends to a substantial depth of the shallower trench structure 18. That is, the neighboring regions of trench sidewall insulation are in direct contact over most of the depth ($D_{T2}$) of the shallower trench structure 18. This region 38 of insulating material is formed by oxidizing the mesa of semiconductor material disposed between the adjacent trenches. In one embodiment, the oxidized region of semiconductor material 38 is about 1.2 μm or less thick between the first and second conductive materials 24, 30 of the trench structures 17, 18. The distance between the trench structures 17, 18 is chosen small enough so that the mesa of semiconductor material between the trenches is completely oxidized during a subsequent thermal oxidation process. The oxide thickness can be varied within limits defined by process and equipment by simply varying the distance between the trenches in the layout. For example, a trench spacing of 0.6 μm yields an oxide thickness of about 1.2 μm between the conductive material 24, 30 of the trench structures 17, 18 and an oxide thickness of e.g. 0.7 μm at the outer trench sidewalls.

Broadly, the process parameters associated with forming the trench structures 17, 18 e.g. such as the trench taper can be selected so that the mesa region of oxidized semiconductor material 38 disposed between the deeper and shallower trenches longitudinally extends to a depth ($D_{MESA\_OX}$) in closer proximity to the bottom 32 of the shallower trench structure 18 than the upper surface 20 of the epitaxial layer 14. As such, some of the semiconductor material disposed between facing insulated sidewalls of the trench structures 17, 18 may remain un-oxidized toward the bottom 32 of the shallower trench structure 18. Alternatively, the entire mesa of semiconductor material is oxidized over the entire depth of the shallower trench structure 18 as shown in FIG. 2. According to this embodiment, the oxidized region of semiconductor material 38 longitudinally extends from the upper surface 20 of the epitaxial layer 14 to the buried layer 16. In either case, the semiconductor structure 10 minimizes electrically floating regions of semiconductor material between adjacent trenches and therefore increases breakdown voltage. The semiconductor structure 10 also reduces the transistor cell layout size by eliminating most or all of the floating mesa of semiconductor material between adjacent trench structures 17, 18. Parasitic capacitance between the conductive fill material 24, 20 of adjacent trench structures 17, 18 and the semiconductor regions is also reduced.

Figure 3:
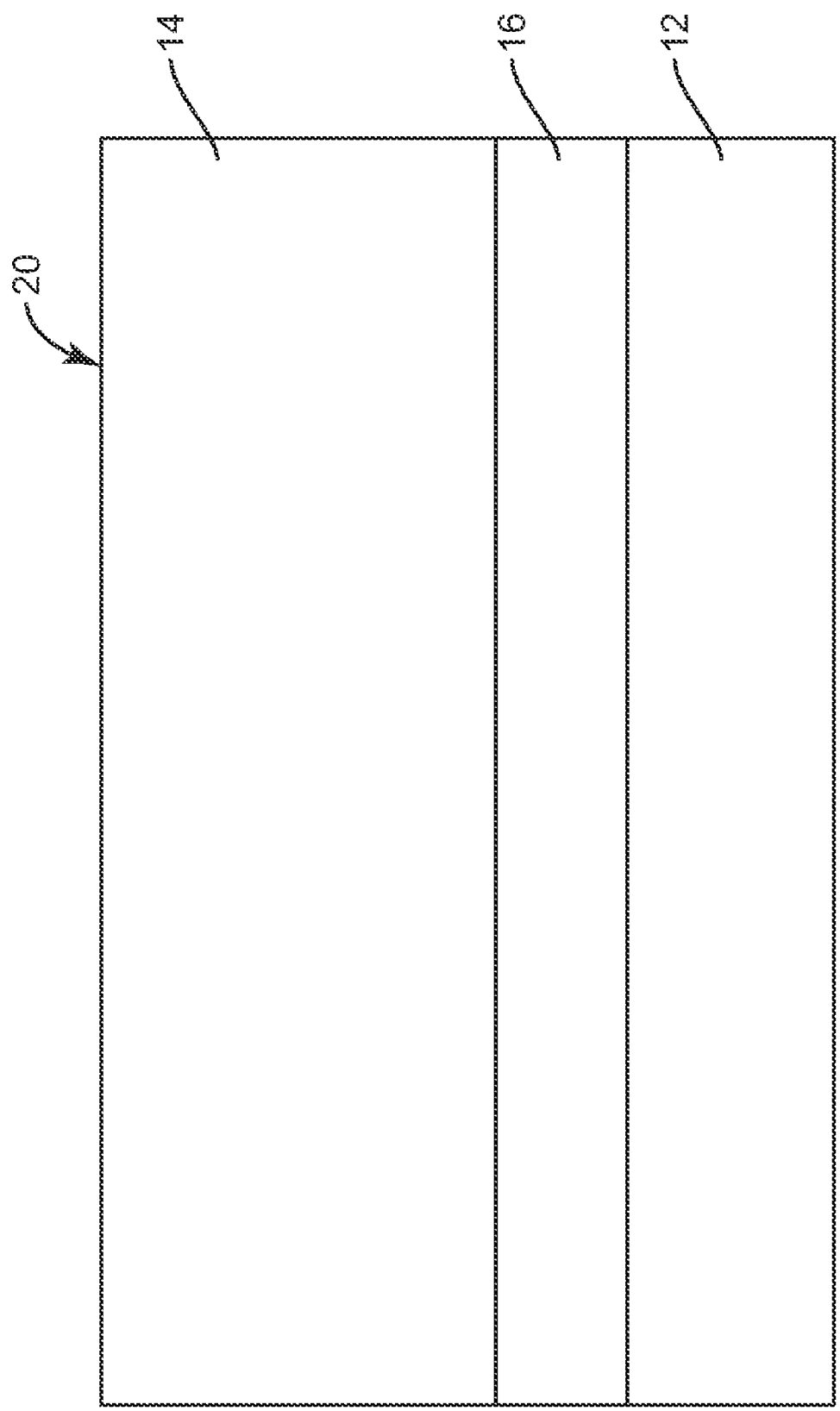
FIGS. 3-13 are schematic cross-sectional views of the semiconductor structure in FIG. 1 during different process steps according to different embodiments.

FIGS. 3-13 illustrate cross-sectional views of several embodiments of fabricating the semiconductor structure 10. In FIG. 3, the semiconductor substrate 12 of the first conductivity is provided and the epitaxial layer 14 of the opposite conductivity is formed on the substrate 12 and the buried layer 16 of the same conductivity as the epitaxial layer 14 is formed between the substrate 12 and the epitaxial layer 14. The buried layer 16 can be formed via any suitable conventional process such as implanting into the p-type substrate with n-type dopants such as phosphorus, arsenic or antimony and annealing, or by outdiffusion, growing the epitaxial layer 14 and further outdiffusion into the substrate 12 and epitaxial layer 14, etc.

Figure 4:
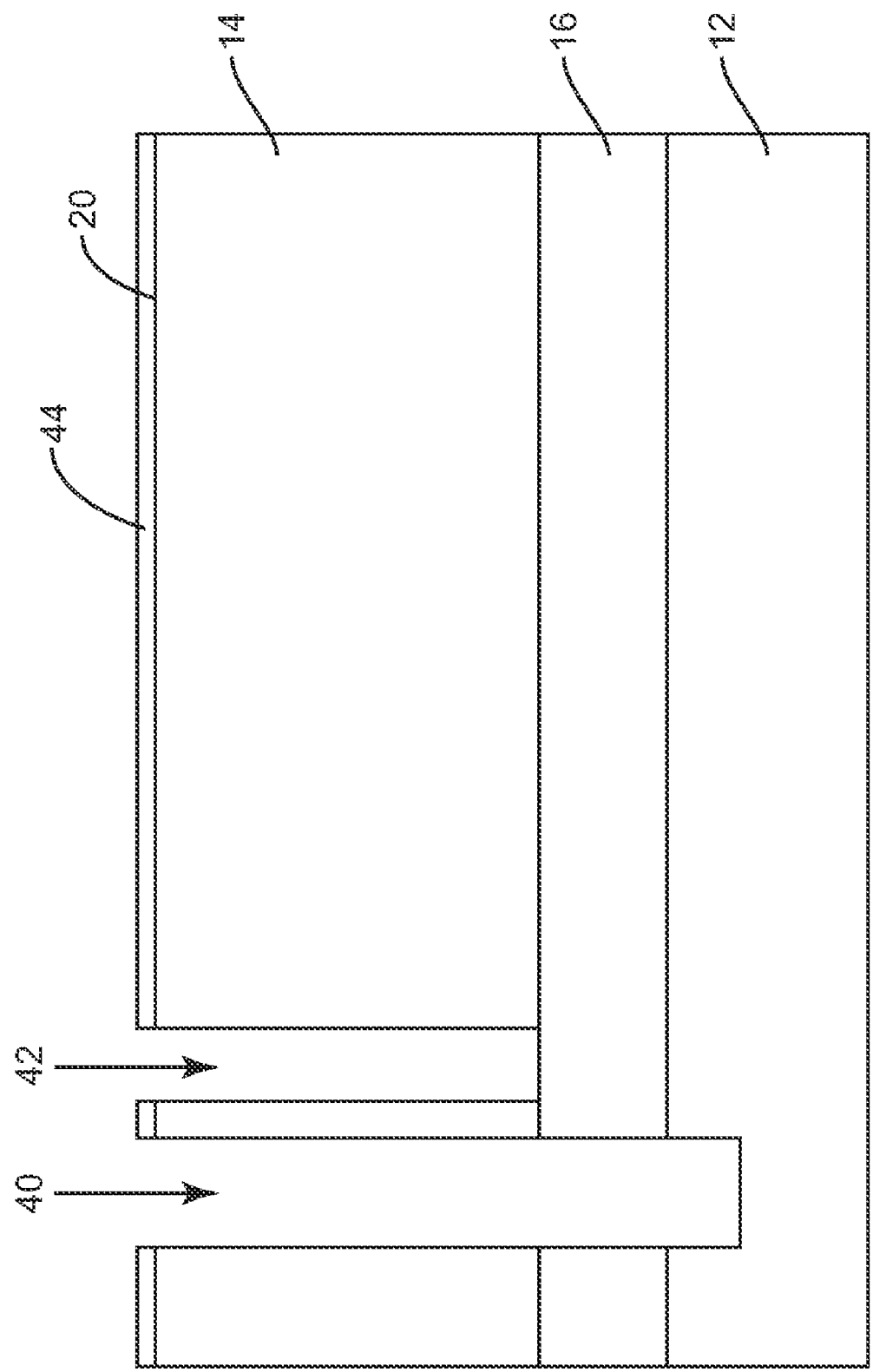

FIG. 4 illustrates a deeper trench 40 and a shallower trench 42 etched at the same time. A hard mask layer 44 is provided and patterned to serve as an etch mask. The deeper and shallower trenches 40, 42 are then anisotropically etched e.g. via a reactive ion etch (RIE) process. The deeper trench 40 for the substrate contact can be chosen wider to result in a greater depth than the shallower trench 42 when the trenches 40, 42 are etched via the same trench etch process. In one embodiment, the deeper trench 40 is about 20% to 50% wider than the shallower trench 42.

Figure 5:
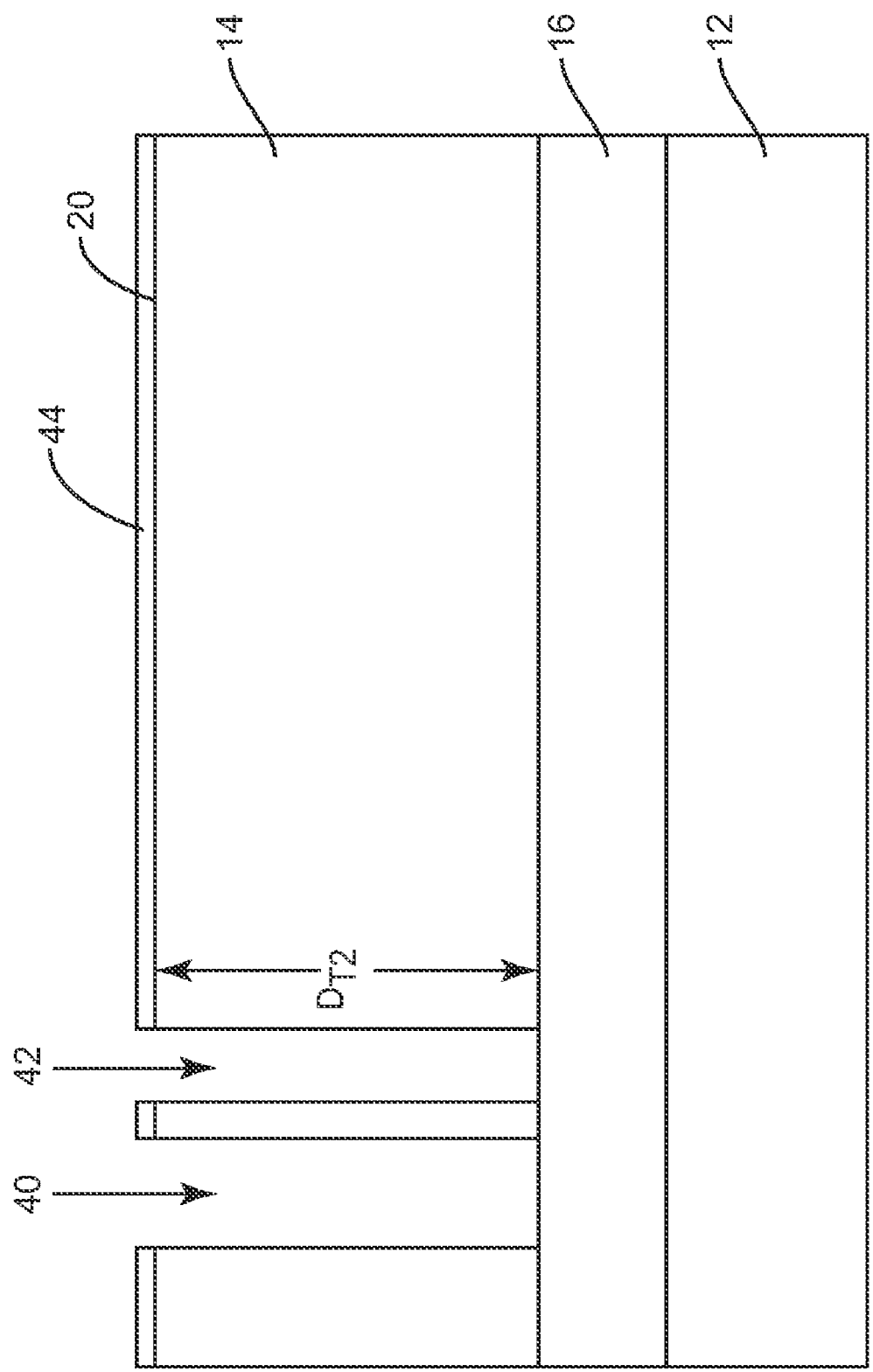
Figure 6:
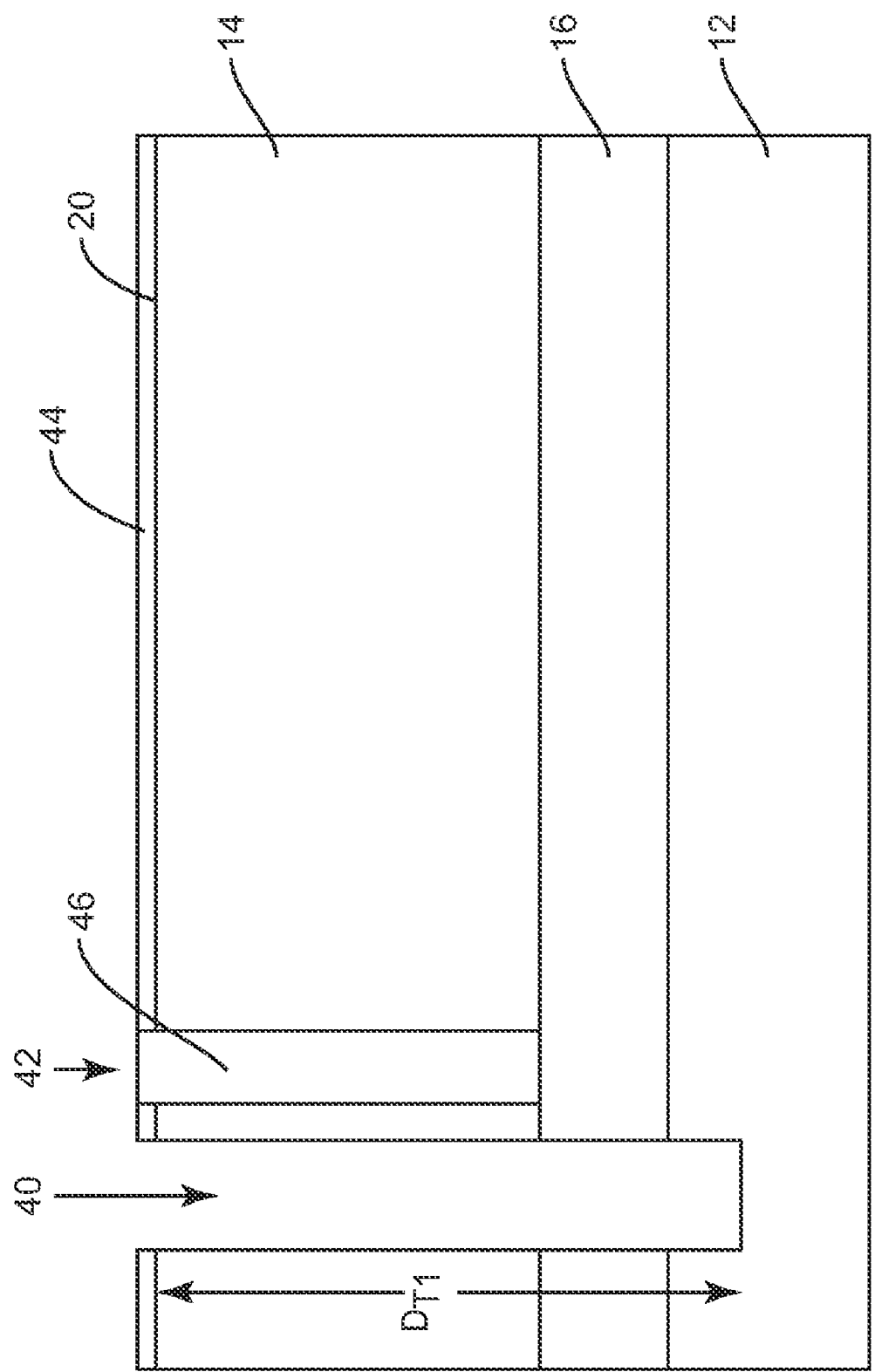

FIGS. 5-6 illustrate an alternate embodiment where the trenches 40, 42 are formed in separate process sequences. According to this embodiment, the hard mask layer 44 defines regions for forming the trenches 40, 42. Both trenches 40, 42 are etched at the same time to a first depth e.g. the desired depth $D_{T2}$ of the shallower trench 42 as shown in FIG. 5. The shallower trench 42 is then masked e.g. by filling the shallower trench 42 with a suitable etch mask material 46 such as carbon. The trench etch process resumes so that the deeper trench 40 is etched to the desired depth ($D_{T1}$) while the shallower trench 42 is masked to prevent further etching in the masked region as shown in FIG. 6. The etch mask material 46 is removed from the shallower trench 42 after the deeper trench 40 is etched to the desired depth. According to this embodiment, precise control of different etch depths for different trench widths is not required because the trenches are formed in separate process sequences.

In either case, trench etching can be done before or after formation of the sidewall insulation. In the first case, a further step to provide sidewall insulation for the lower part of the deeper trench 40 is performed after the trench etch embodiment shown in FIGS. 5-6. According to each of the trench etch embodiments, the deeper trench 40 extends from the upper surface 20 of the epitaxial layer 14 to the substrate 12 and the shallower trench 42 extends from the upper surface 20 of the epitaxial layer 14 to the buried layer 16, but not to the substrate 12.

Figure 7:
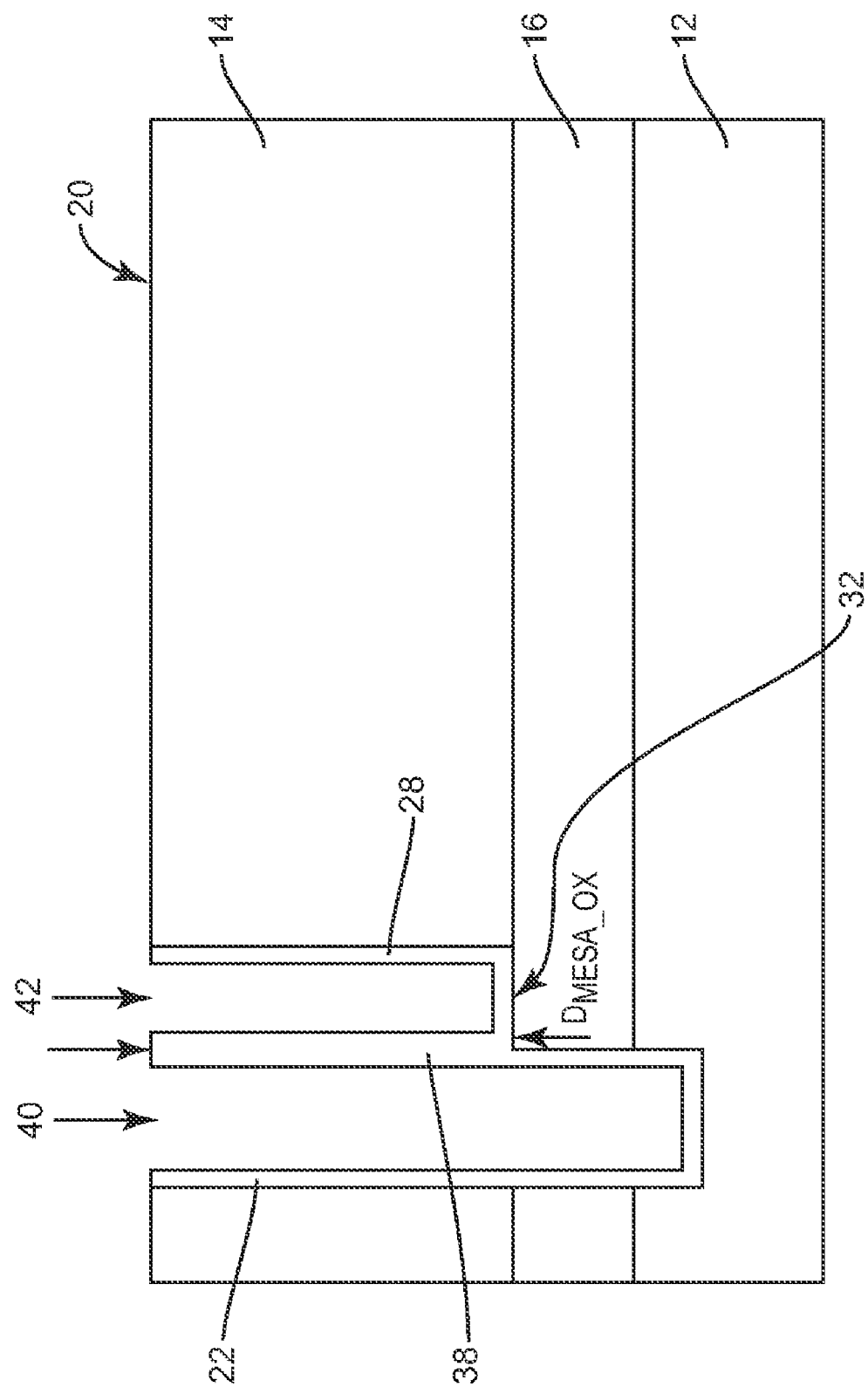

FIG. 7 illustrates the trenches 40, 42 after an oxidation process such as thermal oxidation. The oxidation process oxidizes the semiconductor material along the sides and bottom of the trenches 40, 42 to provide the trench sidewall insulation 22, 28. The oxidation process is controlled so that the mesa of epitaxially grown semiconductor material disposed between facing sides of the trenches 40, 42 is oxidized from the upper surface 20 of the epitaxial layer 14 to a depth ($D_{MESA\_OX}$) in closer proximity to the bottom 26 of the shallower trench structure 18 than the upper surface 20 of the epitaxial layer 14. Accordingly, the oxidized region of semiconductor material 38 longitudinally extends to a substantial depth of the shallower trench structure 18. As such, some of the semiconductor material disposed between facing insulated sidewalls of the trench structures 17, 18 may remain un-oxidized toward the bottom 32 of the shallower trench structure 18 e.g. as a consequence of a positive trench taper. Alternatively, the entire mesa of semiconductor material is oxidized over the entire depth ($D_{T2}$) of the shallower trench structure 18 as shown in FIGS. 2 and 7. In addition, a further dielectric layer such as oxide or nitride can be deposited to further increase the insulation thickness.

Figure 8:
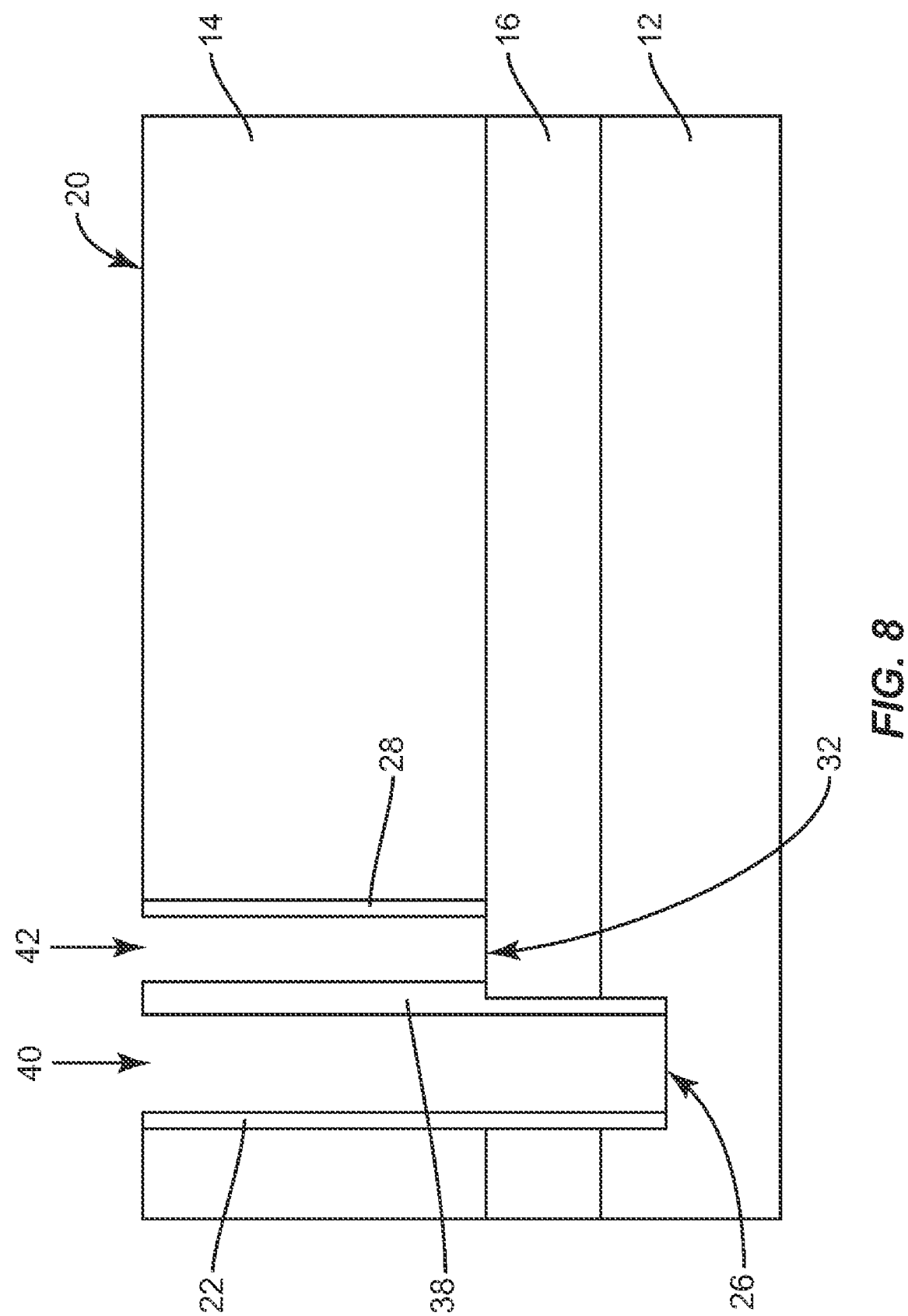

FIG. 8 illustrates the trenches 40, 42 after the oxide in the bottom 26, 32 of the trenches 40, 42 is removed e.g. via an anisotropic oxide etch step. If the trench etch hard mask 44 is still in place, the hard mask 44 can be used to protect the upper surface 20 of the epitaxial layer 14 during the bottom oxide removal process. The region of the substrate 12 just below the deeper trench 40 can be doped to improve contact resistance with the substrate 12. The region of the buried layer 16 just below the shallower trench 42 can also be doped to improve contact resistance with the buried layer 16.

Figure 9:
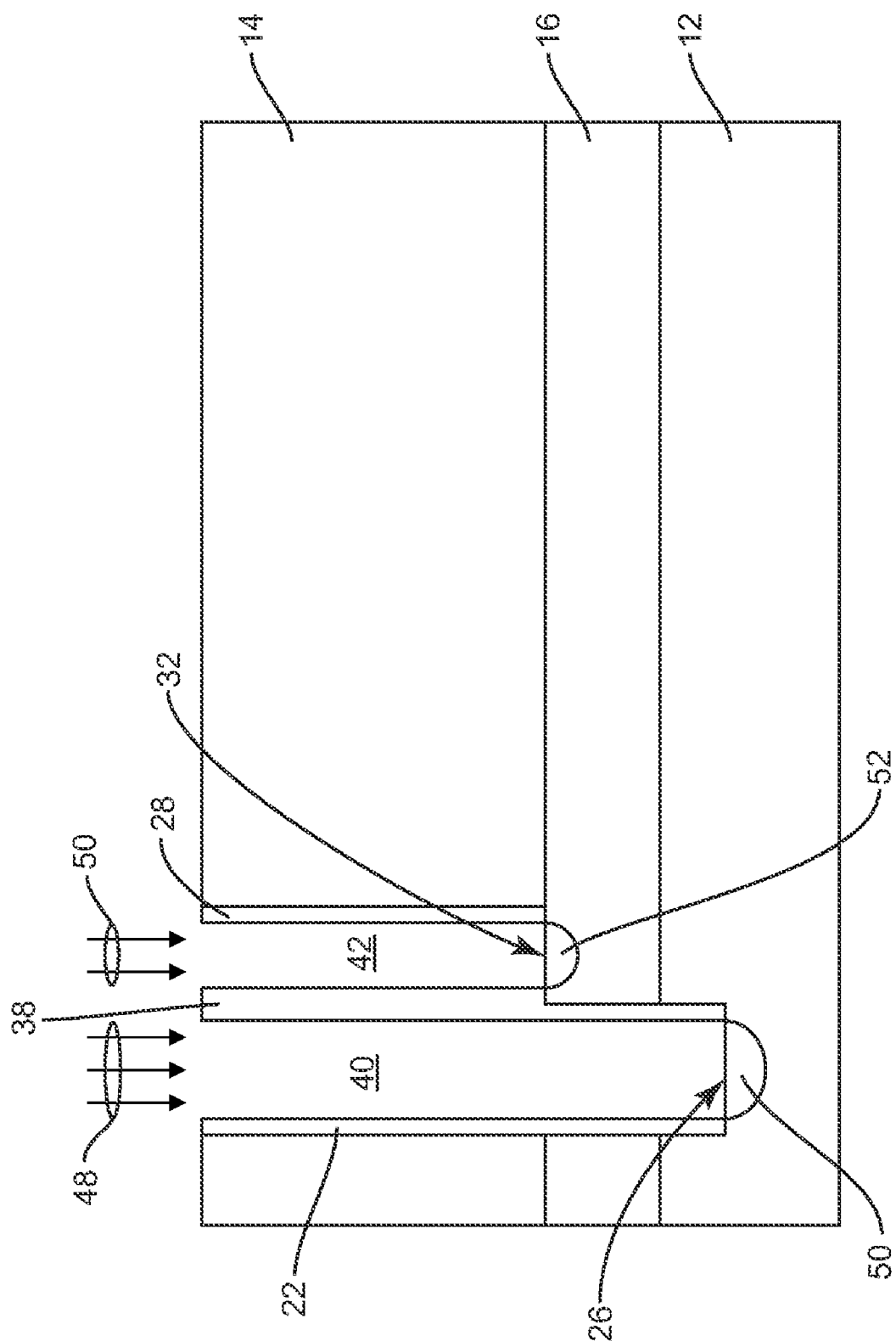

FIG. 9 illustrates the trenches 40, 42 during an implantation step. The trench bottoms can be implanted with p-type and/or n-type dopants 48, 50 e.g. depending on the type of polysilicon doping used to improve contact resistance. In one embodiment, dopants of the first conductivity are implanted into the bottom 26 of the deeper trench 40 to increase the conductivity of the substrate 12 in a region 50 of the substrate 12 under the deeper trench 40 and dopants of the opposite conductivity are implanted into the bottom 32 of the shallower trench 42 to increase the conductivity of the buried layer 16 in a region 52 of the buried layer 16 under the shallower trench 42. During implantation the surface 20 can be masked by a mask layer such as a part of the trench hard mask 44 or a photoresist layer.

Figure 10:
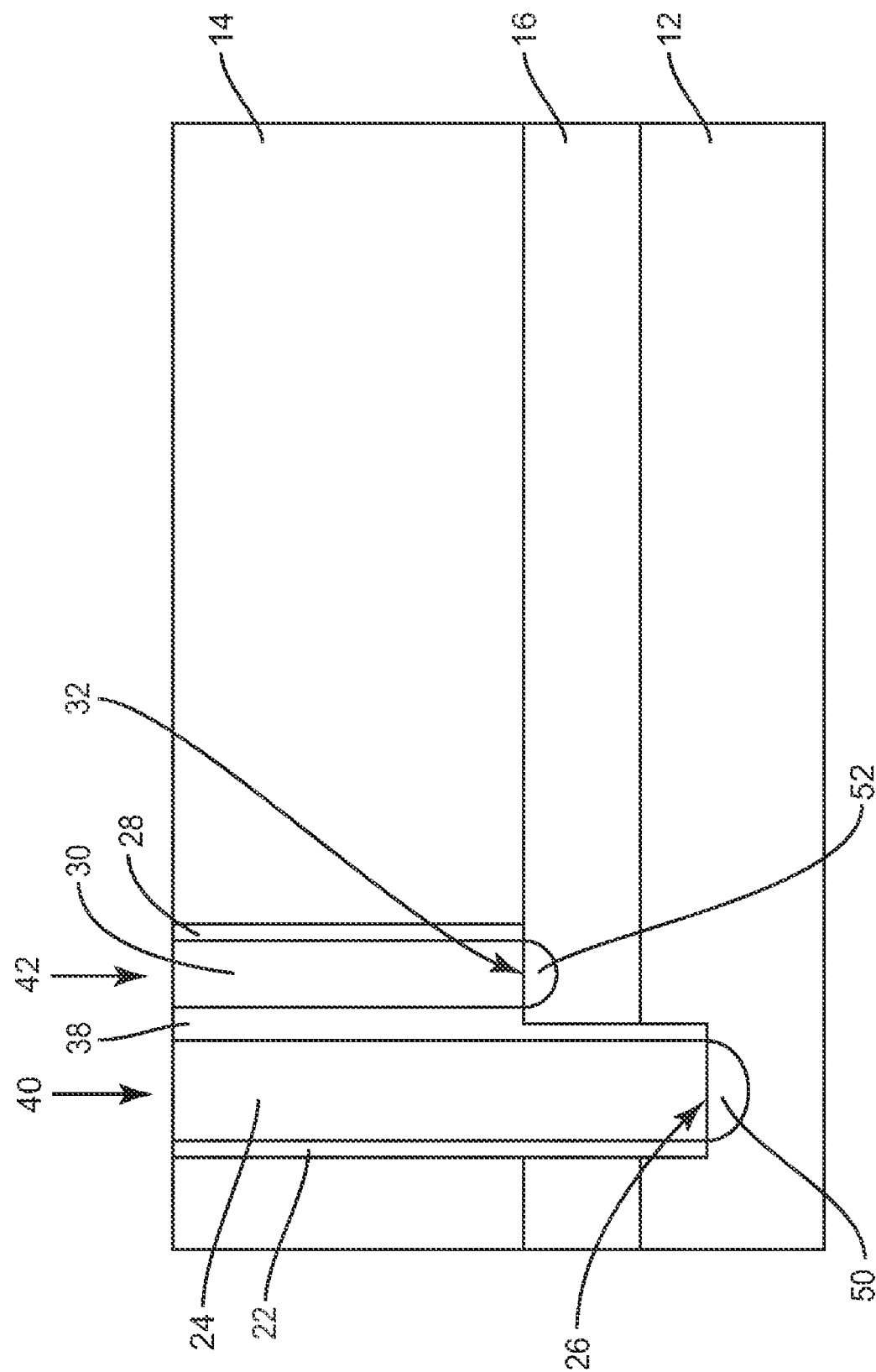

FIG. 10 illustrates an alternate embodiment of reducing the contact resistance below the trenches 40, 42. According to this embodiment, the conductive material 24 filling the deeper trench 40 is doped polysilicon and dopants of the first conductivity type are diffused out of highly doped polysilicon into the underlying region 50 of the substrate 12. The conductive material 30 filling the shallower trench 42 is also doped polysilicon and dopants of the second conductivity type are diffused out of highly doped polysilicon into the underlying region 52 of the buried layer 16. For example, the shallower trench 42 can be filled with phosphorus or arsenic doped polysilicon which is outdiffused to contact the buried layer 16 when the substrate 12 is p-type and the buried layer 16 is n-type. The deeper trench 40 can be filled with boron doped polysilicon which is outdiffused to contact the p-type substrate 12.

In an embodiment, one of the trenches is filled during a first polysilicon deposition with a non-polysilicon material such as carbon and the other trench is filled with doped polysilicon. The carbon is removed from the one trench which is then filled with polysilicon doped of a suitable conductivity while the other trench is masked. In another embodiment, the deposited polysilicon is removed in a subsequent masked etch step. In yet another embodiment, if a silicide or thin metal layer is provided in the bottom region of one or both trenches to provide ohmic contacts to the respective underlying semiconductor material, a single polysilicon deposition step is sufficient. In yet another embodiment the trenches 40, 42 are filled with a metal or a silicide.

Figure 11:
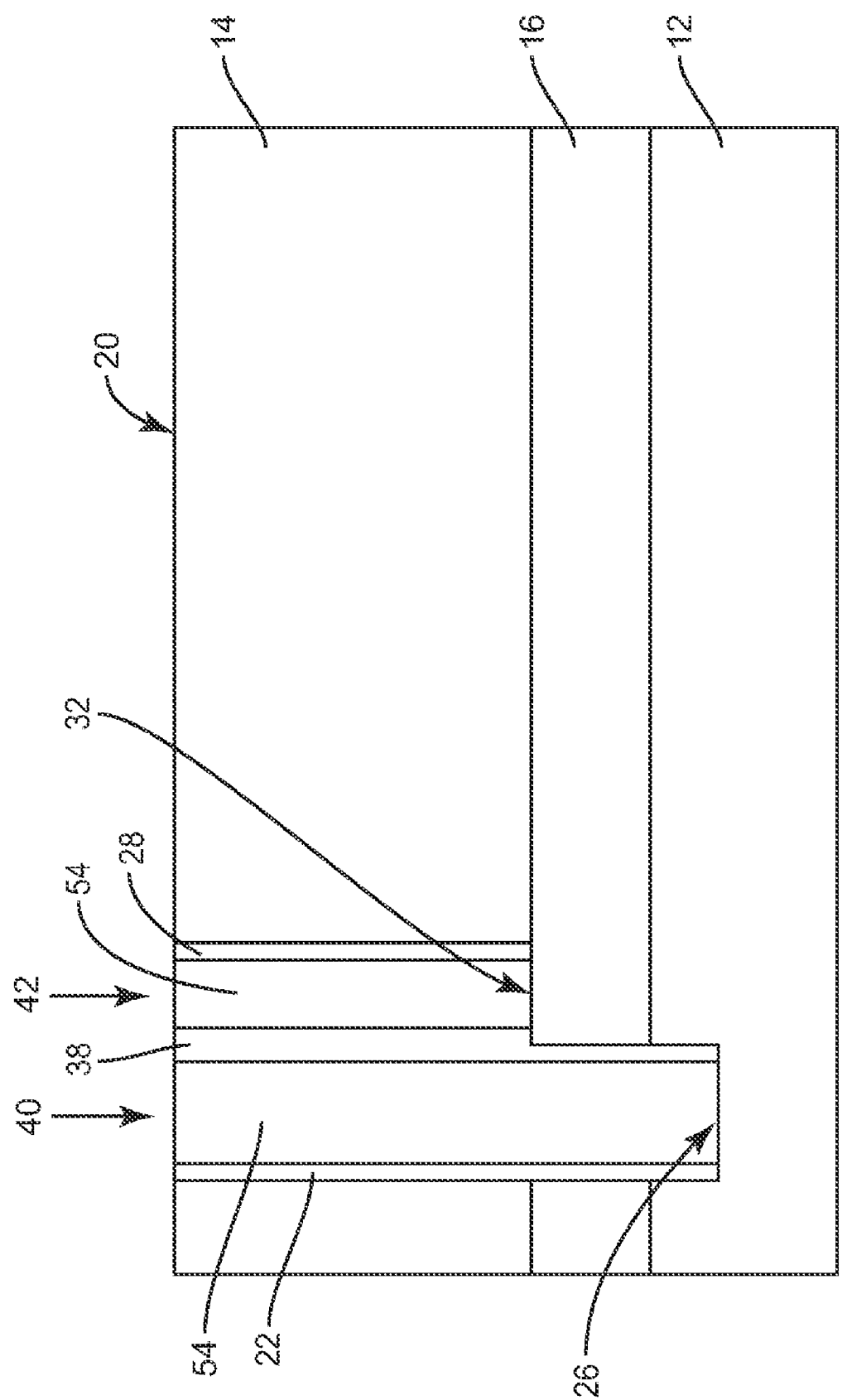
Figure 12:
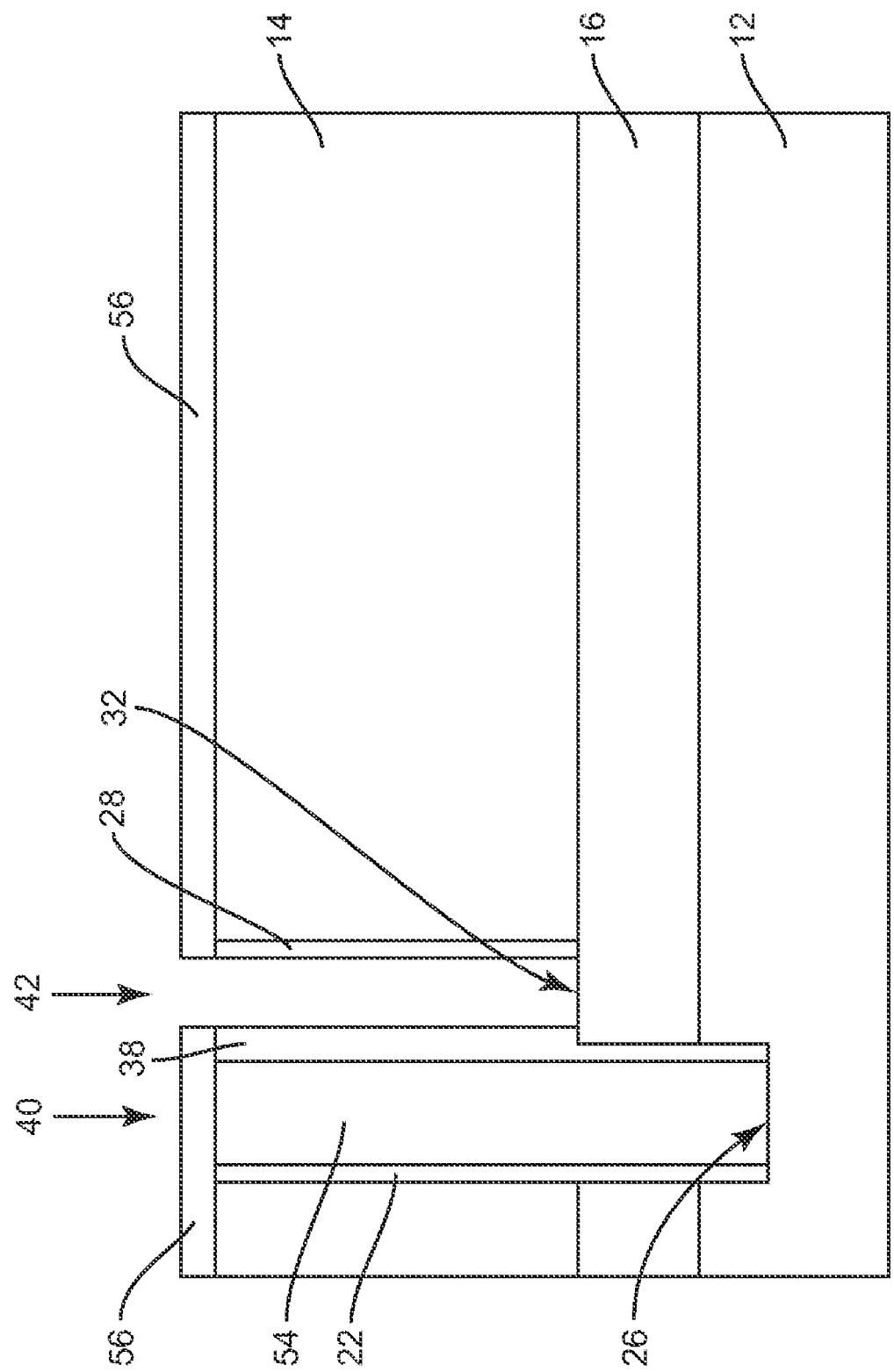
Figure 13:
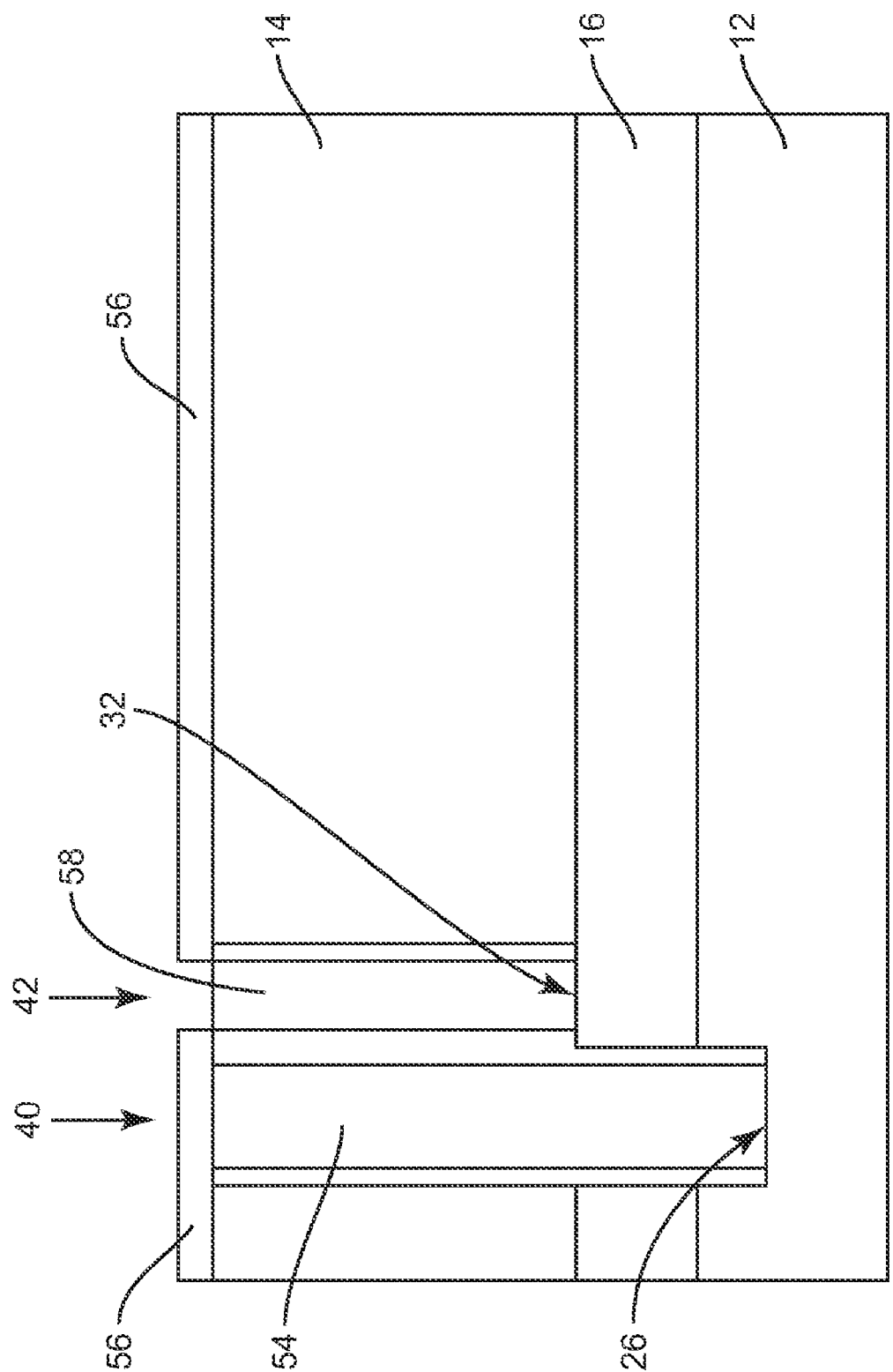

FIGS. 11-13 illustrate an alternate trench fill embodiment. According to this embodiment, both trenches 40, 42 are both filled with polysilicon 54 doped of the same conductivity e.g. as shown in FIG. 11. The polysilicon 54 is then removed from one of the trenches and the other trench and surface 20 of the epitaxial layer 14 is protected with a mask 56 e.g. as shown in FIG. 12. The unmasked trench is filled with polysilicon 58 doped of the opposite conductivity while the other trench remains masked e.g. as shown in FIG. 13 so that the polysilicon 54 in the deeper trench 40 has the same conductivity as the substrate 12 and the polysilicon 58 in the shallower trench 42 has the same conductivity as the buried layer 16 between the substrate 12 and the epitaxial layer 14. Alternatively, one or both trenches 40, 42 can be filled with a metal such as tungsten or highly conducting carbon or carbon nanotubes. In each case, respective contacts 34, 36 to the conductive material 24, 30 of the trench structures 17, 18 can be formed e.g. as shown in FIG. 2 in addition to formation of active and/or passive devices. The trench structures 17, 18 can be formed in a very early process stage, but also at any later stage dependent on the available thermal budget.

Figure 14:
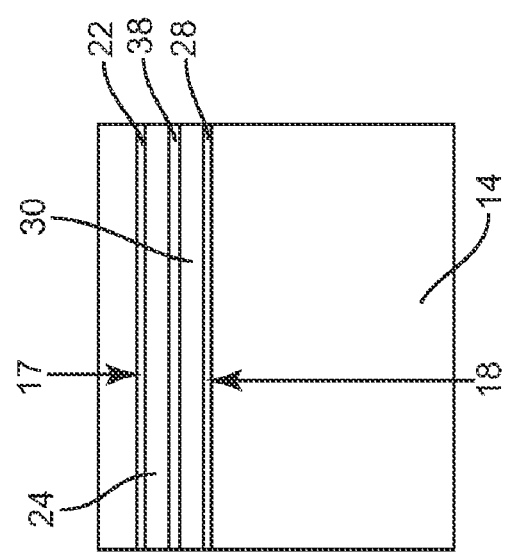
FIG. 14-18 are top-down plan views of different trench structure orientations for the semiconductor structure of FIG. 1 according to different embodiments.
Figure 15:
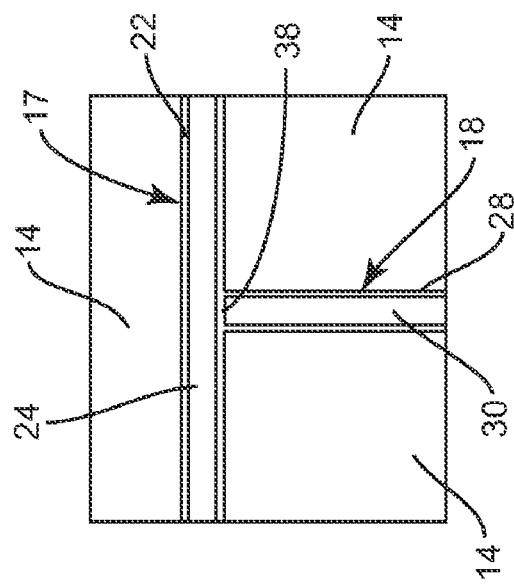
Figure 16:
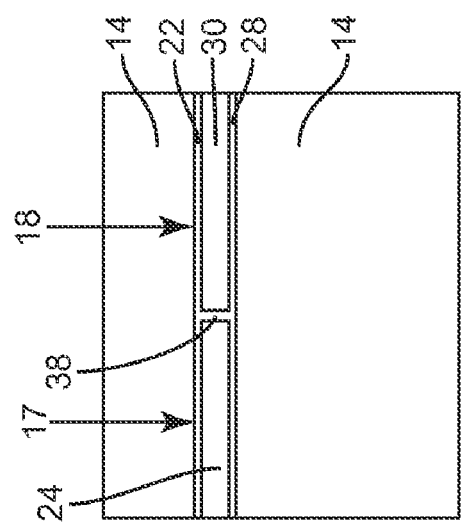

FIGS. 14-16 illustrate top-down plan views of various orientation embodiments of the trench structures 17, 18. In FIG. 14, the trench structures 17, 18 extend parallel to one another. In FIG. 15, the trench structures 17, 18 extend perpendicular to one another. In FIG. 16, the trench structures 17, 18 extend end-to-end in a straight line. One or both of the trench structures 17, 18 may form a closed loop.

Figure 17:
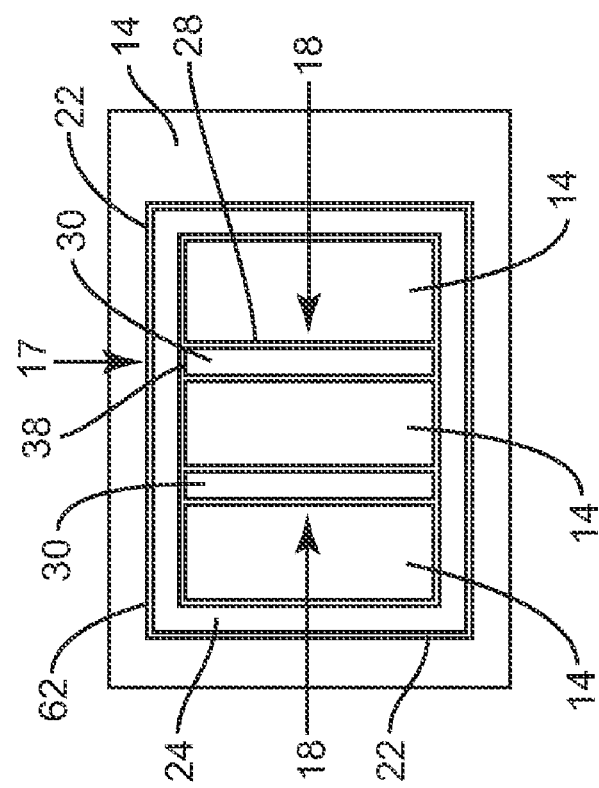
Figure 18:
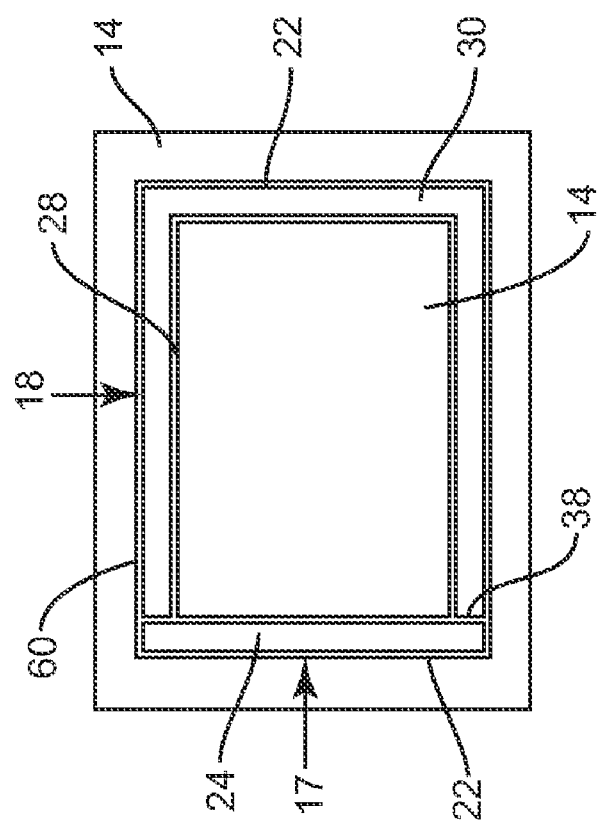

FIG. 17 illustrates a top-down plan view of an embodiment of the trench structures 17, 18 together forming a closed ring 60. FIG. 18 illustrates a top-down plan view of an embodiment of the deeper trench structure 17 forming a closed ring 62 and the shallower trench structure 18 laterally extending from one side of the closed ring 62 to an opposing side of the closed ring 62. Various types of active and/or passive devices can be fabricated using any of the semiconductor structure embodiments described herein.

Figure 19:
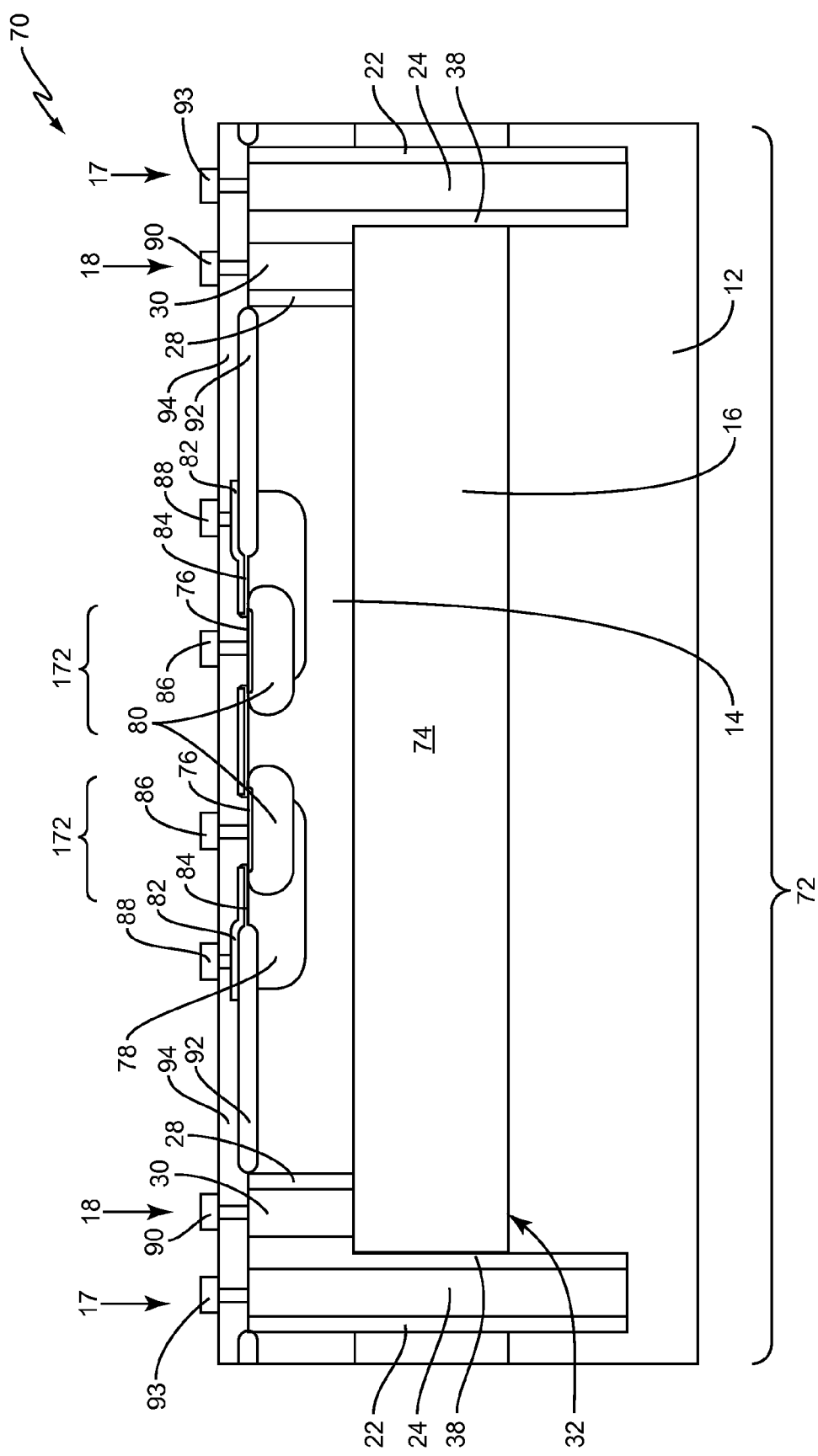
FIG. 19 is a schematic cross-sectional view of an integrated circuit including the semiconductor structure in FIG. 1 according to an embodiment.

FIG. 19 illustrates a cross-sectional view of an embodiment of an integrated circuit 70. The integrated circuit 70 includes the substrate 12 of the first conductivity, the epitaxial layer 14 of the opposite conductivity and the buried layer 16 of the same conductivity as the epitaxial layer 14 interposed between the substrate 12 and the epitaxial layer 14 as previously described herein. One or more transistors of a power transistor arrangement 72 are formed at a region of the substrate 12. Two transistors cells 172 of the power transistor arrangement 72 are shown in FIG. 19, but any number of cells may be included.

The deeper trench structure 17 extends through the epitaxial layer 14 and the buried layer 16 to the substrate 12 for electrically isolating each transistor 72 located in this region of the substrate 12 from transistors in adjacent regions (out of view). The conductive material 24 of the deeper trench structure 17 is in electrical contact with the substrate 12 as previously described herein. The shallower trench structure 18 extends through the epitaxial layer 14 to the buried layer 16 with the conductive material 30 of the shallower trench structure 18 in electrical contact with the buried layer 16 also as described previously herein.

Between the trench structures 17, 18 is the oxidized mesa of semiconductor material 38 laterally extending from the conductive material 24 of the deeper trench structure 17 to the conductive material 30 of the shallower trench structure 18. The oxidized mesa of semiconductor material 38 longitudinally extends to a depth in closer proximity to the bottom 32 of the shallower trench structure 18 than the upper surface 20 of the epitaxial layer 14. In one embodiment, each transistor 72 is a vertically diffused MOS transistor with a drain region 74 formed by the buried layer 16. A source region 76 and a body region 80 below the source region 76 are formed in the epitaxial layer 14. A gate electrode 82 is spaced apart from the channel region in the body region 80 by an underlying insulator 84. Respective source, gate and drain contacts 86, 88, 90 are also provided. A separate contact 93 to the conductive material 24 of the deeper trench structure 17 is also provided. The contacts 86, 88, 90 are isolated from each other and the epitaxial layer 14 where appropriate by insulators 92, 94. A junction termination extension 78 can be provided. The power transistor arrangement 72 may include bipolar devices, diodes, etc. in addition to or instead of MOS transistors. The epitaxial layer 14 can be formed by an epitaxial process, by diffusion, etc. The substrate 12 can be a well formed in another substrate. The buried layer 16 can be formed by epitaxy, etc.

Figure 20:
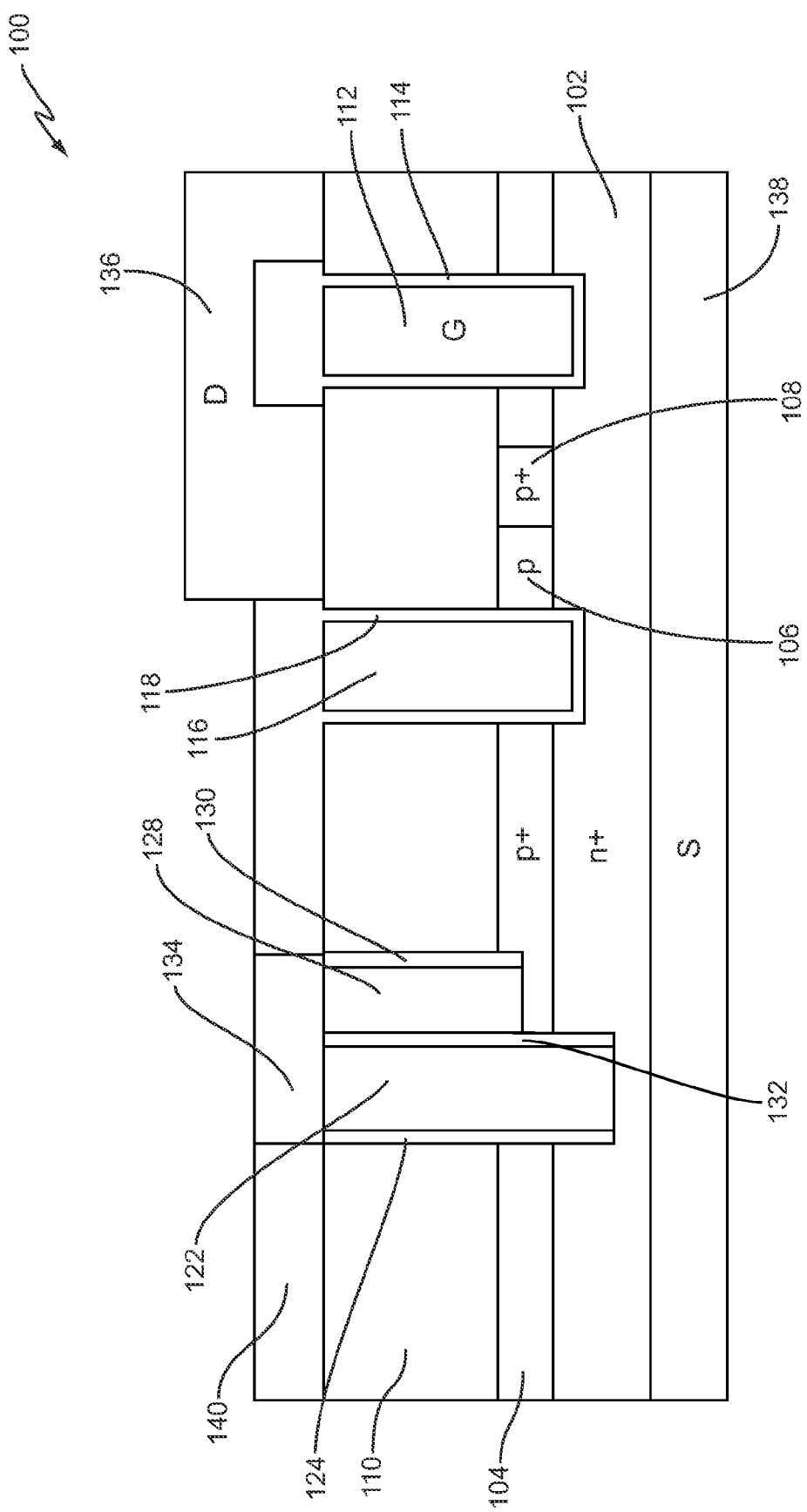
FIG. 20 is a schematic cross-sectional view of a power transistor including the semiconductor structure in FIG. 1 according to an embodiment.

FIG. 20 illustrates a cross-sectional view of an embodiment of a power transistor structure 100 including a source region 102 of a first conductivity (e.g. n-type) formed in a semiconductor substrate. A body region 104 of a second conductivity (e.g. p-type) is disposed above the source region 102. Certain regions 106, 108 of the body 104 may be doped more or less heavily than others as desired. A drain region 110 of the first conductivity is disposed above the body region 104 so that the body region 104 is interposed between the source region 102 and the drain region 110. A gate structure with a gate conductor 112 surrounded by an insulator 114 extends through the drain region 110 and the body region 104 into the source region 102. A second gate structure with a gate conductor 116 surrounded by an insulator 118 similarly extends through the drain region 110 and the body region 104 into the source region 102. A deeper trench structure 120 extends through the drain region 110 and the body region 104 to the source region 102 and includes conductive material 122 in electrical contact with the source region 102. The conductive material 122 of the deeper trench structure 120 is separated from the drain and body regions 110, 104 by sidewall insulation 124. A shallower trench structure 126 extends through the drain region 110 to the body region 104 and includes a conductive material 128 in electrical contact with the body region 104. The conductive material 128 of the shallower trench structure 126 is separated from the drain region 110 by sidewall insulation 130. An oxidized region of semiconductor material 132 laterally extends from a side of the deeper conductive material 122 facing the shallower trench structure 126 to a side of the shallower conductive material 128 facing the deeper trench structure 120. The oxidized region of semiconductor material 132 longitudinally extends to a depth in closer proximity to the bottom of the shallower trench structure 126 than the upper surface of the drift region 110. A shared contact 134 connects the conductive materials 122, 128 of the trench structures 120, 126. A drain electrode 136 contacts the drain region 110 and a source electrode 138 contacts the source region 102. An insulator layer 140 separates the drain electrode 136 from the gate structure.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor structure comprising:
    a semiconductor substrate of a first conductivity;

an epitaxial layer of a second conductivity on the substrate;

a buried layer of the second conductivity interposed between the substrate and the epitaxial layer;

a first trench structure extending through the epitaxial layer and the buried layer to the substrate, the first trench structure including a first sidewall insulation and a first conductive material in electrical contact with the substrate at a bottom of the first trench structure;

a second trench structure extending through the epitaxial layer to the buried layer, the second trench structure including a second sidewall insulation and a second conductive material in electrical contact with the buried layer at a bottom of the second trench structure; and a region of insulating material laterally extending from the conductive material of the first trench structure to the conductive material of the second trench structure and longitudinally extending to a substantial depth of the second trench structure.

2. The semiconductor structure of claim 1, wherein the region of insulating material is an oxidized region of semiconductor material longitudinally extending from an upper surface of the epitaxial layer to a depth of the second trench structure.

3. The semiconductor structure of claim 1, wherein the region of insulating material is an oxidized region of semiconductor material longitudinally extending from an upper surface of the epitaxial layer to the buried layer.

4. The semiconductor structure of claim 1, wherein a trench of the first trench structure is 20% to 50% wider than a trench of the second trench structure.

5. The semiconductor structure of claim 1, wherein the first trench structure forms a closed ring and the second trench structure laterally extends from a first side of the closed ring to a second side of the closed ring.

6. The semiconductor structure of claim 1, wherein the first trench structure and the second trench structure together form a closed ring.

7. The semiconductor structure of claim 1, wherein the first and second trench structures extend parallel to one another.

8. The semiconductor structure of claim 1, wherein the first and second trench structures extend perpendicular to one another.

9. The semiconductor structure of claim 1, wherein the first and second trench structures extend end-to-end in a straight line.

10. The semiconductor structure of claim 1, wherein the region of insulating material comprises neighboring regions of trench sidewall insulation that are in direct contact longitudinally along the depth of the second trench structure.

11. The semiconductor structure of claim 1, wherein the region of insulating material is an oxidized region of semiconductor material.

* * * * *